United States Patent
Besancon et al.

(10) Patent No.: US 10,325,784 B2
(45) Date of Patent: Jun. 18, 2019

(54) METHOD FOR MANUFACTURING AN ENCAPSULATION COVER FOR AN ELECTRONIC PACKAGE AND ELECTRONIC PACKAGE COMPRISING A COVER

(71) Applicant: STMicroelectronics (Grenoble 2) SAS, Grenoble (FR)

(72) Inventors: Benoit Besancon, Villard Bonnot (FR); Alexandre Mas, Saint Egreve (FR); Karine Saxod, Les Marches (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/685,552

(22) Filed: Aug. 24, 2017

(65) Prior Publication Data

US 2018/0190512 A1  Jul. 5, 2018

(30) Foreign Application Priority Data

Jan. 3, 2017  (FR) .................................... 17 50048

(51) Int. Cl.
*H01L 21/56* (2006.01)
*H01L 23/31* (2006.01)
*H01L 23/552* (2006.01)
*H01L 23/053* (2006.01)
*H01L 23/06* (2006.01)
*H01L 23/10* (2006.01)
*H01L 23/24* (2006.01)
*H01L 23/42* (2006.01)
(Continued)

(52) U.S. Cl.
CPC ........ *H01L 21/565* (2013.01); *H01L 21/4803* (2013.01); *H01L 21/52* (2013.01); *H01L 23/04* (2013.01); *H01L 23/053* (2013.01); *H01L 23/06* (2013.01); *H01L 23/10* (2013.01); *H01L 23/24* (2013.01); *H01L 23/315* (2013.01); *H01L 23/3192* (2013.01); *H01L 23/42* (2013.01); *H01L 23/4334* (2013.01); *H01L 23/552* (2013.01)

(58) Field of Classification Search
CPC .......................... H01L 21/565; H01L 21/4817
USPC ....................................................... 257/687
See application file for complete search history.

(56) References Cited

U.S. PATENT DOCUMENTS 5,705,851 A * 1/1998 Mostafazadeh ..... H01L 23/3128
257/675
6,353,257 B1  3/2002 Huang
(Continued)

FOREIGN PATENT DOCUMENTS

DE  102005032664 A1  1/2007
EP     2448001 A2  5/2012
(Continued)

OTHER PUBLICATIONS

INPI Search Report and Written Opinion for FR 1750048 dated Oct. 17, 2017 (9 pages).

*Primary Examiner* — Jami Valentine Miller
(74) *Attorney, Agent, or Firm* — Crowe & Dunlevy

(57) ABSTRACT

A method for manufacturing a cover for an electronic package includes placing an insert having opposite faces between opposite faces of a cavity of a mold. A coating material is injected in the mold cavity around the insert. The coating material is then set to form a substrate that is overmolded around the insert and produce the cover.

12 Claims, 8 Drawing Sheets

(51) Int. Cl.
*H01L 23/433* (2006.01)
*H01L 21/52* (2006.01)
*H01L 23/04* (2006.01)
*H01L 21/48* (2006.01)

(56) References Cited

U.S. PATENT DOCUMENTS

| | | | |
|---|---|---|---|
| 6,414,385 B1 | 7/2002 | Huang et al. | |
| 9,472,692 B2 | 10/2016 | Sorrieul et al. | |
| 9,773,740 B2 | 9/2017 | Saxod et al. | |
| 9,818,664 B2 | 11/2017 | Besancon et al. | |
| 9,870,947 B1 | 1/2018 | Camos et al. | |
| 10,147,834 B2 | 12/2018 | Herard et al. | |
| 2002/0195701 A1 | 12/2002 | Bemmerl et al. | |
| 2003/0042596 A1 | 3/2003 | Craine, Jr. et al. | |
| 2004/0082114 A1 | 4/2004 | Horng | |
| 2005/0044618 A1 | 3/2005 | Shimizu et al. | |
| 2005/0161755 A1 | 7/2005 | Huang et al. | |
| 2009/0086449 A1 | 4/2009 | Minamio et al. | |
| 2009/0261468 A1 | 10/2009 | Kroeninger et al. | |
| 2010/0308453 A1 | 12/2010 | Scheid et al. | |
| 2010/0314743 A1* | 12/2010 | Li | H01L 23/4334 257/690 |
| 2011/0049531 A1 | 3/2011 | Oka et al. | |
| 2012/0104454 A1 | 5/2012 | Coffy | |
| 2012/0146243 A1 | 6/2012 | Song et al. | |
| 2013/0079068 A1 | 3/2013 | Coffy et al. | |
| 2014/0061447 A1 | 3/2014 | Campbell et al. | |
| 2015/0227829 A1* | 8/2015 | Finn | G06K 19/07752 235/488 |
| 2017/0127567 A1 | 5/2017 | Besancon et al. | |
| 2017/0141241 A1 | 5/2017 | Yu et al. | |
| 2018/0058920 A1 | 3/2018 | Saxod et al. | |
| 2018/0190511 A1* | 7/2018 | Mas | H01L 21/565 |
| 2018/0190512 A1* | 7/2018 | Besancon | H01L 23/053 |
| 2018/0190562 A1 | 7/2018 | Figuiere et al. | |
| 2018/0190838 A1* | 7/2018 | Saxod | B29C 45/14065 |
| 2018/0337104 A1 | 11/2018 | Sorrieul | |
| 2019/0027381 A1 | 1/2019 | Kadoguchi et al. | |
| 2019/0027416 A1 | 1/2019 | Saxod et al. | |

FOREIGN PATENT DOCUMENTS

| | | |
|---|---|---|
| FR | 2758908 A1 | 7/1998 |
| FR | 2835654 A1 | 8/2003 |
| JP | S5818223 A | 2/1983 |

\* cited by examiner

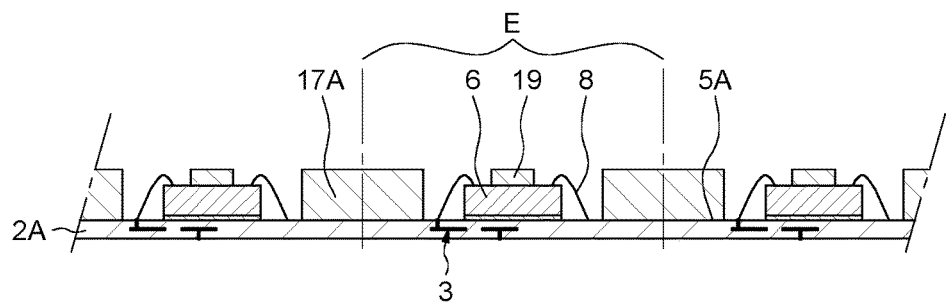
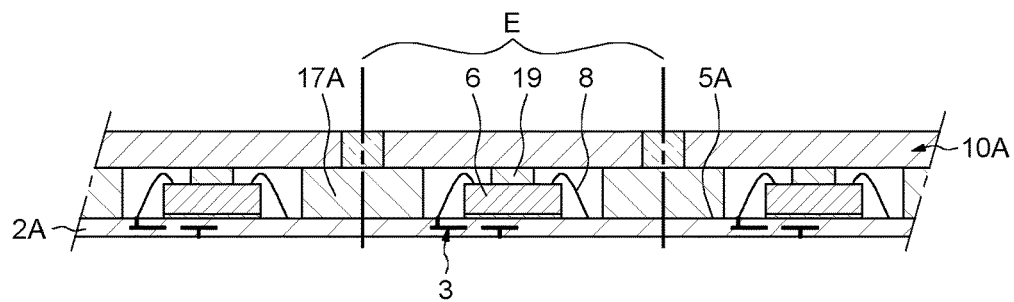
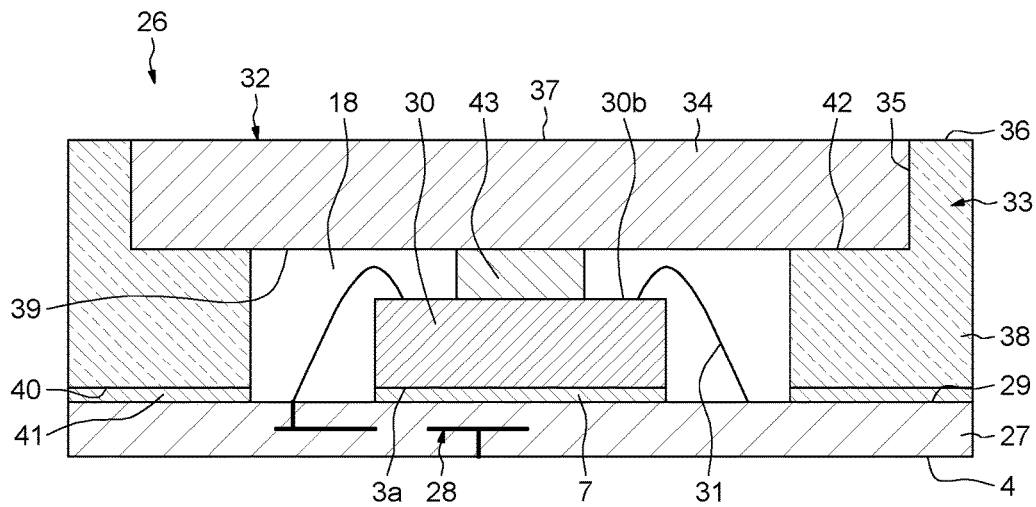

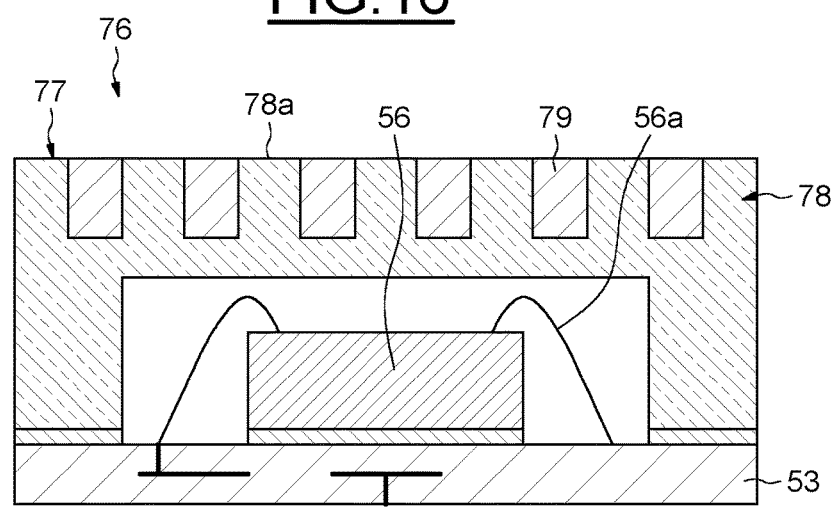
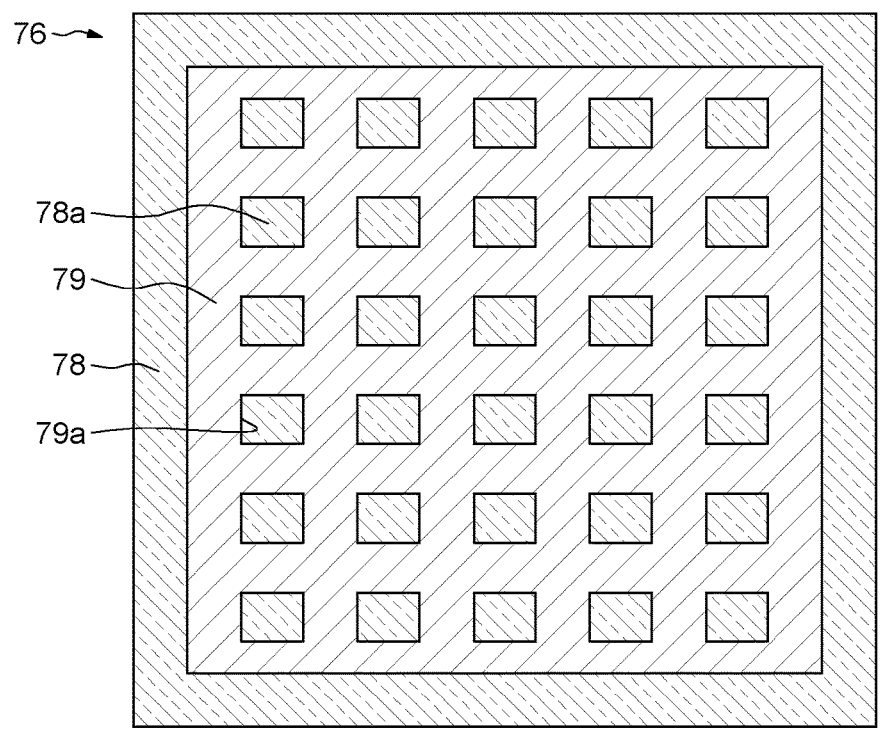

METHOD FOR MANUFACTURING AN ENCAPSULATION COVER FOR AN ELECTRONIC PACKAGE AND ELECTRONIC PACKAGE COMPRISING A COVER

PRIORITY CLAIM

This application claims the priority benefit of French Application for Patent No. 1,750,048, filed on Jan. 3, 2017, the disclosure of which is hereby incorporated by reference in its entirety.

TECHNICAL FIELD

The present invention relates to the field of electronic packages.

BACKGROUND

It is known practice to produce electronic packages which comprise electronic chips mounted on carrier substrates and which comprise encapsulation covers for the chips, which covers are fixed to the carrier substrates. For specific needs, in particular optical, heat dissipation, electrical or electromagnetic needs, encapsulation covers are provided with members suited to these needs. These members are transferred onto the covers after the latter have been mounted on carrier substrates and are fixed to the covers by way of layers or beads of adhesive.

SUMMARY

According to one embodiment, a method is proposed for manufacturing at least one encapsulation cover for an electronic package including at least one electronic chip. The method comprises the following steps: placing at least one insert, having opposite faces, in a cavity of a mold having opposite faces, in a position such that at least part of one of the faces of the insert makes contact with at least part of one of the faces of said cavity of the mold; injecting a coating material into said cavity; and setting the coating material in order to obtain an overmolded substrate within which said insert is at least partly included, such that the encapsulation cover produced comprises at least one insert and at least a portion of said overmolded substrate.

The method may comprise a later step of cutting through said overmolded substrate and at a distance from said insert.

At least part of the other face of said insert may make contact with at least part of the other face of said cavity of the mold.

The mold may comprise at least one layer made of a compressible material forming at least part of at least one of said faces of said cavity, said insert bearing on this layer.

One of said faces of the cavity of the mold may comprise at least one zone surrounded by at least one groove, such that said overmolded substrate of the obtained cover is provided with at least one protruding ring-shaped rib corresponding to said groove of the mold, protruding with respect to one of the faces of said insert.

The method may comprise a later cutting step carried out through said overmolded substrate and said protruding ring-shaped rib.

An electronic package is also proposed which comprises: a carrier substrate; at least one electronic chip having a back face fixed to a front mounting face of the carrier substrate; and an encapsulation cover of said chip, comprising a substrate that is overmolded around an insert, said cover being fixed at least above said mounting face of said carrier substrate in a position such that it extends above the chip.

Said encapsulation cover may be fixed above said carrier substrate by way of an annular bead of adhesive or an annular strip of adhesive, interposed between a peripheral zone of the carrier substrate and a peripheral zone of a back face of said overmolded substrate.

Said overmolded substrate may be provided with a ring-shaped rib surrounding said chip at a distance, the cover being fixed above said carrier substrate by way of a strip of adhesive interposed between said carrier substrate and said ring-shaped rib.

Said insert may have a front face that is at least partly uncovered by said overmolded substrate.

Said insert may have a back face that is at least partly uncovered by said overmolded substrate.

Said insert may comprise a portion that protrudes backwards, facing the front face of the chip.

Said backward-protruding portion may be connected to the front face of the chip by way of a layer of adhesive.

Said insert may be made of a heat conducting material.

Said insert may be made of a material capable of forming an electromagnetic protection screen.

Said insert may comprise a substrate extending in front of the chip.

Said insert may comprise a grating extending in front of the chip.

An encapsulation cover for an electronic package is also proposed, which comprises: an insert having opposite faces; and an overmolded substrate having opposite faces within which said insert is included, such that this insert has at least one face that is at least partly uncovered on the side of one of the faces of the overmolded substrate.

Said overmolded substrate may be provided with a ring-shaped rib that protrudes with respect to one of said opposite faces of said insert.

Said insert may have at least one back face that is at least partly uncovered.

Said insert may be made of a heat conducting material.

Said insert may be made of a material capable of forming an electromagnetic protection screen.

Said insert may comprise a substrate.

Said substrate may comprise a protruding portion.

Said insert may comprise a grating.

BRIEF DESCRIPTION OF THE DRAWINGS

Electronic packages and modes of manufacture of encapsulation covers for electronic packages will now be described by way of non-limiting examples, which are illustrated by the appended drawings in which:

FIG. 5 shows a step of manufacturing the package of FIG. 1, in cross section;

FIG. 6 shows another step of manufacturing the package of FIG. 1, in cross section;

FIG. 7 shows a cross section of another electronic package;

FIG. 16 shows a cross section of another electronic package;

FIG. 17 shows a horizontal cross section of the electronic package in FIG. 16;

DETAILED DESCRIPTION

Figure 1:
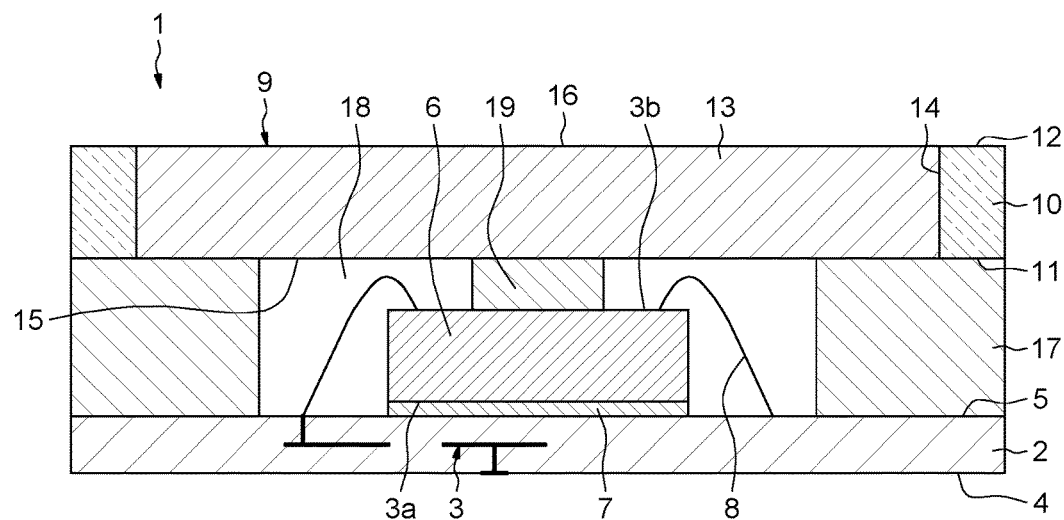
FIG. 1 shows a cross section of an electronic package.

FIG. 1 illustrates an electronic package 1 which comprises a carrier substrate 2, made of a dielectric material, including an integrated network of electrical connections 3 and having a back face 4 and a front mounting face 5. The outline of the carrier substrate 2 is, for example, square or rectangular.

The package 1 comprises an electronic chip 6 mounted above the front face 5 of the carrier substrate 2 by way of a layer of adhesive 7 interposed between the front face 5 of the carrier substrate 2 and a back face 3a of the electronic chip 6.

The chip 6 is electrically connected to the connection network 3 by way of electrical connection wires 8 connecting pads of the front face 5 of the carrier substrate 2 and pads of the front face 3b of the chip 6, the back face 4 of the carrier substrate 2 being provided with electrical connection pads for the external electrical connections of the package 1. According to one variant embodiment, the chip 6 could be mounted on the carrier substrate 2 by way of electrical connection elements, such as balls, which electrically connect the chip 6 and the electrical connection network 3.

The package 1 comprises an encapsulation cover 9 for the chip 6 and electrical connection wires 8 in front of the carrier substrate 2, the encapsulation cover 9 being located above and at a distance from the chip 6, parallel to the carrier substrate 2, and having an outline corresponding to that of the carrier substrate 2.

The encapsulation cover 9 comprises a ring-shaped overmolded substrate 10 made of a coating material, for example a thermosetting resin, which has opposite back and front faces 11 and 12, respectively, which are flat and parallel, and comprises an insert 13 in the form of a plate and the periphery of which is integrated and held within a through-passage 14 of the overmolded substrate 10. The insert 13 extends in front of and at a distance from the chip 6 and has, for example, a square or rectangular outline. For example, the insert 13 has back and front faces 15 and 16, respectively, which are not covered by the overmolded substrate 10, and which extend substantially in the plane of the back and front faces 11 and 12 of the overmolded substrate 10.

The encapsulation cover 9 is fixed above the carrier substrate 2 by way of a local ring-shaped connecting spacer 17 interposed between a peripheral zone of the front face 5 of the carrier substrate 2 and a peripheral zone of the back face of the encapsulation cover 9, the ring-shaped spacer 17 extending at a distance from the periphery of the chip 6 and the electrical connection wires 8. The spacer 17 may partially cover the back face 11 of the overmolded substrate 10 or cover the back face 11 of the overmolded substrate 10 and a peripheral portion of the back face 15 of the insert 13.

The thickness of the spacer 17 determines the gap between the cover 9 and the carrier substrate 2. The spacer 17 may comprise an adhesive including spacing balls which determine a minimum gap between the cover 9 and the carrier substrate 2.

Thus, the carrier substrate 2, the cover 9 provided with the insert 13 and the spacer 17 define a sealed chamber 18 in which the chip 6 is located.

Between the front face 3b of the chip 6 and the back face 15 of the insert 13 (which extends through the overmolded substrate 10) a local spacer 19 is interposed, the local spacer being placed at a distance from the electrical connection wires 8.

According to one variant embodiment, the insert 13 is made of a heat conducting material, for example a metal, and the local spacer 19 is made of a heat conducting adhesive. Thus, the insert 13 included in the cover 9 forms a means for dissipating the heat generated by the chip 6 to the outside via the attached local spacer 19 which forms a thermal seal. In addition, the insert 13 may be made of a material capable of forming an electromagnetic protection screen between the chip 6 and the exterior.

The encapsulation cover 9 is the result of a wafer-scale manufacturing process which will now be described.

Figure 2:
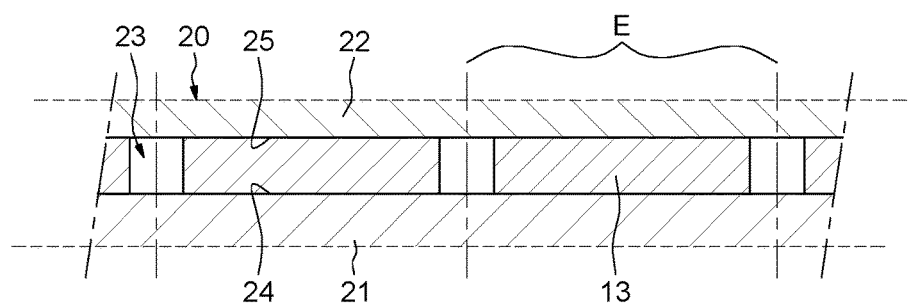
FIG. 2 shows a cross section of a mold for manufacturing an encapsulation cover for the package of FIG. 1, in one manufacturing step.
Figure 3:
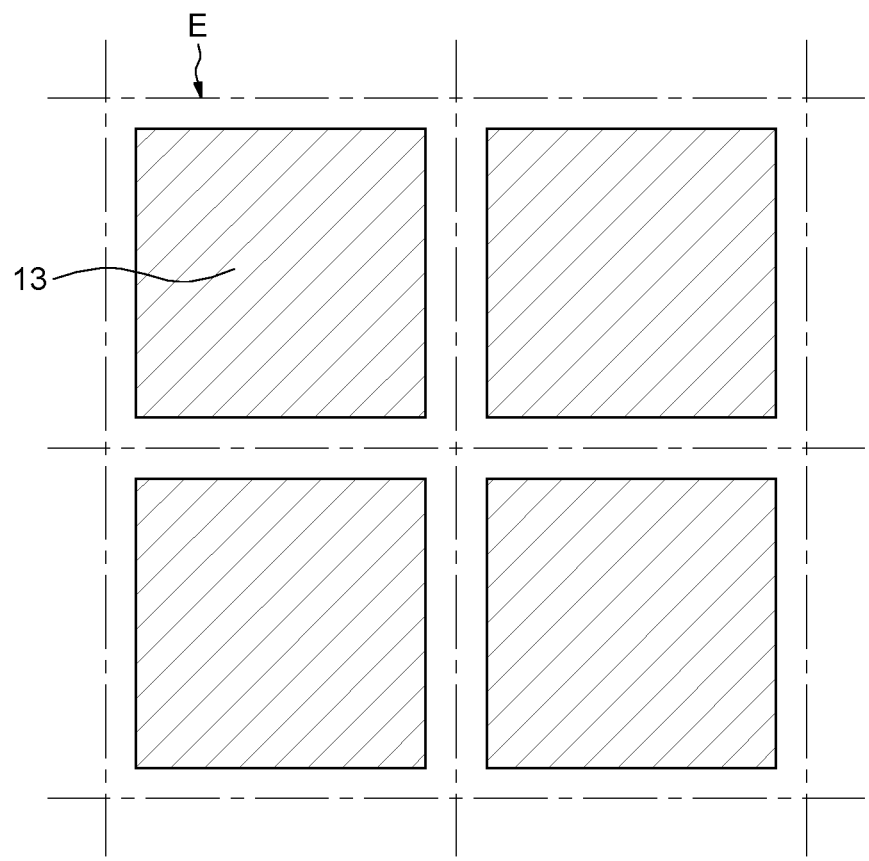
FIG. 3 shows a horizontal cross section of the mold of FIG. 2.

As illustrated in FIGS. 2 and 3, a mold 20 is obtained which comprises a lower part 21 and an upper part 22 between which a cavity 23 is formed. The parts 21 and 22 of the mold 20 have faces 24 and 25 which are opposite, flat and parallel, and which delimit the cavity 23 in the direction of the thickness of the covers 9 to be obtained. Optionally, these opposite faces 24 and 25 are covered with layers made of a compressible material.

A plurality of inserts 13 is also obtained, resulting for example from cutting a substrate along parallel rows and parallel columns.

With the mold 20 open, inserts 13 are placed on the face 24, at respective locations in the sites E corresponding to covers 9 to be obtained, these sites E being adjacent and arranged in a square or rectangular matrix.

Next, the mold 20 is closed by placing the upper part 22 above the lower part 21. In this position, the opposite faces 15 and 16 of the inserts 13 are facing the opposite faces 24 and 25 of the cavity 23 and are pressed against the aforementioned optional compressible layers. Free spaces separate the inserts 13, these spaces straddling the rows and columns separating the adjacent sites E.

Figure 4:
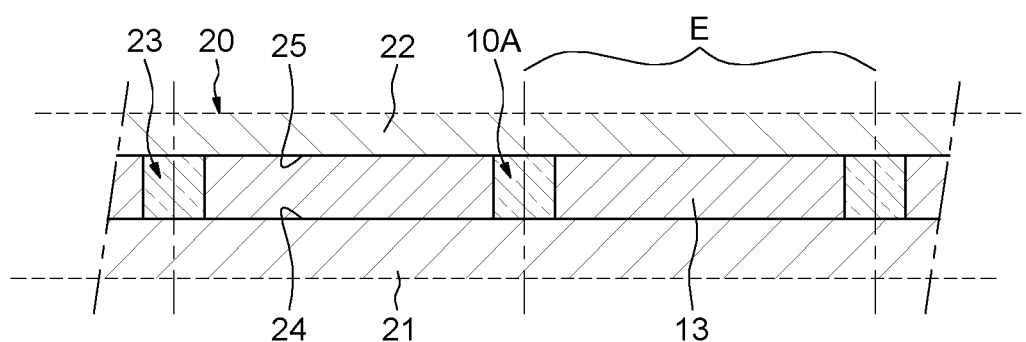
FIG. 4 shows a cross section of the manufacturing mold of FIG. 2, in another step of manufacturing the encapsulation cover.

Next, as illustrated in FIG. 4, a coating material, for example a thermosetting epoxy resin, is injected into the cavity 23 of the mold 20 and fills said free spaces, and this coating material is set.

After removal from the mold, a collective substrate 10A provided with inserts 13 and overmolded around these inserts 13 is obtained.

According to one variant embodiment, the collective substrate 10A is cut along the rows and columns delimiting the sites E in order to obtain covers 9.

According to another variant embodiment, as illustrated in FIG. 5, a collective carrier substrate 2A is obtained which is provided, at sites E corresponding to electronic packages 1 to be obtained, with respective electronic connection networks 3 and which is provided, on its front face 5A, with electronic chips 6 at respective locations in the sites E and with electrical connection wires 8, these sites E being adjacent and arranged in a square or rectangular matrix.

Next, collective beads of adhesive 17A are spread over the front face 5A of the collective carrier substrate 2A, along border zones between the sites E surrounding the central zones of the sites E in which the chips 6 are located. Local blobs of conductive adhesive are deposited on the chips 6, corresponding to local spacers 19 to be obtained.

Next, the overmolded collective substrate 10A, provided with the inserts 13, is placed on top of the beads of adhesive 17A and the blobs of adhesive corresponding to local spacers 19 and the adhesive is set so as to fix the collective substrate 10A above the collective carrier substrate 2A and the inserts 13 above the chips 6.

Next, the assembly formed is cut along rows and columns separating the sites E, perpendicularly to the collective substrates 2A and 10A and through the beads of adhesive 17A, between and at a distance from the inserts 13.

A plurality of electronic packages 1, produced at the sites E, is then obtained, in each one of which the carrier substrate 2 is a portion of the collective carrier substrate 2A, the cover 9 comprises an overmolded substrate 10 formed by a portion of the overmolded collective substrate 10A, including an insert 13, and the connecting spacer 17 is a portion of the collective beads of set adhesive 17A, the cover 9 resulting from the substrate 10 being overmolded around the insert 13, the chip 6 and the insert 13 being connected by the local spacer 19.

FIG. 7 illustrates an electronic package 26 which comprises a carrier substrate 27 including an integrated network of electrical connections 28 and provided, on a front mounting face 29, with an electronic chip 30, the chip 30 being connected to the electrical connection network 28 by electrical connection wires 31.

The electronic package 26 comprises an encapsulation cover 32 which comprises a ring-shaped overmolded substrate 33 made of a coating material, and an insert 34 which takes the form of a plate located in front of the chip 30 and the periphery of which is integrated and held within a through-passage 35 of the overmolded substrate 33. The overmolded substrate 33 and the insert 34 have front faces 36 and 37, respectively, located in one and the same plane parallel to the carrier substrate 27.

The ring-shaped overmolded substrate 33 is provided, as one piece, with a ring-shaped rib 38 which protrudes with respect to a back face 39 of the insert 34 and which is located around and at a distance from the periphery of the chip 30 and the electrical connection wires 31.

The ring-shaped rib 38 has a back face 40 which is fixed to the front face 29 of the carrier substrate 27 by way of a local ring-shaped strip of adhesive 41. In the example shown, the periphery of the back face 39 of the insert 34 is adjoined to a ring-shaped front face 42 of the ring-shaped rib 38, such that the corresponding part of the ring-shaped rib 38 forms a ring-shaped spacer between the carrier substrate 27 and the insert 34 of the cover 32.

A local spacer 43 is interposed between the front face 30b of the chip 30 and the back face 39 of the insert 34.

According to one variant embodiment, in the same way as for the electronic package 1 described above, the insert 34 is made of a heat conducting material, for example a metal, and the attached local spacer 43 is made of a heat conducting adhesive. Thus, the insert 34 included in the cover 32 forms a means for dissipating the heat generated by the chip 30 to the outside via the local spacer 43. The insert 34 may be made of a metal material capable of forming, in addition, an electromagnetic protection screen between the chip 56 and the exterior.

The encapsulation cover 32 is the result of a wafer-scale manufacturing process which will now be described.

Figure 8:
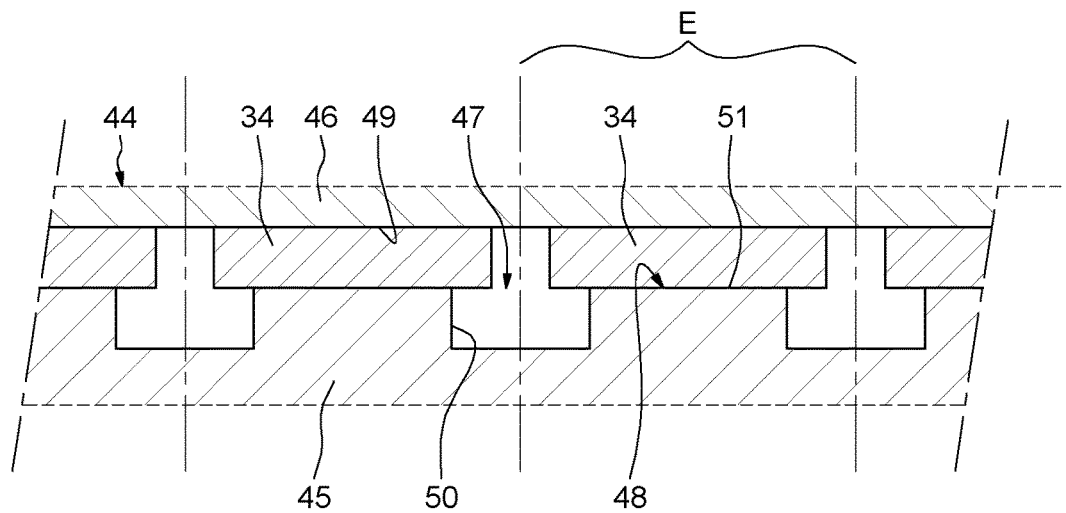
FIG. 8 shows a cross section of a mold for manufacturing an encapsulation cover for the package of FIG. 7, in one manufacturing step.

As illustrated in FIG. 8, a mold 44 is obtained which comprises a lower part 45 and an upper part 46 between which a cavity 47 is formed. The parts 45 and 46 of the mold 44 have opposite faces 48 and 49 which delimit the cavity 47 in the direction of the thickness of the covers 32 to be obtained.

The face 48 of the lower part 45 of the mold 44 has adjacent sites E arranged in a matrix, corresponding to covers 32 to be obtained. The face 48 has cross-shaped grooves 50 which are formed along rows and columns of the matrix forming the sites E and which are of equal depth.

Thus, at each site E, the face 48 of the lower part 45 of the mold 44 comprises flat zones 51 which are circumscribed by corresponding portions of the grooves 50.

The face 49 of the upper part 46 of the mold 44 is flat and parallel to the zones 51 of the lower part 45 of the mold 44.

Optionally, the flat zones 51 of the lower part 45 of the mold 44 and the face 49 of the upper part 46 of the mold 44 are covered with layers made of a compressible material.

A plurality of inserts 34 is also obtained.

With the mold 44 open, inserts 34 are placed such that, when the mold is closed, the inserts 34 are interposed between the zones 51 of the lower part 45 and the face 49 of the upper part 46 of the mold 44, respectively, at the respective sites E corresponding to covers 32 to be obtained. In this position, the inserts are at a distance from one another and leave free spaces between them which communicate with the grooves 50, the grooves being partially covered such that, in cross section, these free spaces and the grooves 50 form T-shapes.

Figure 9:
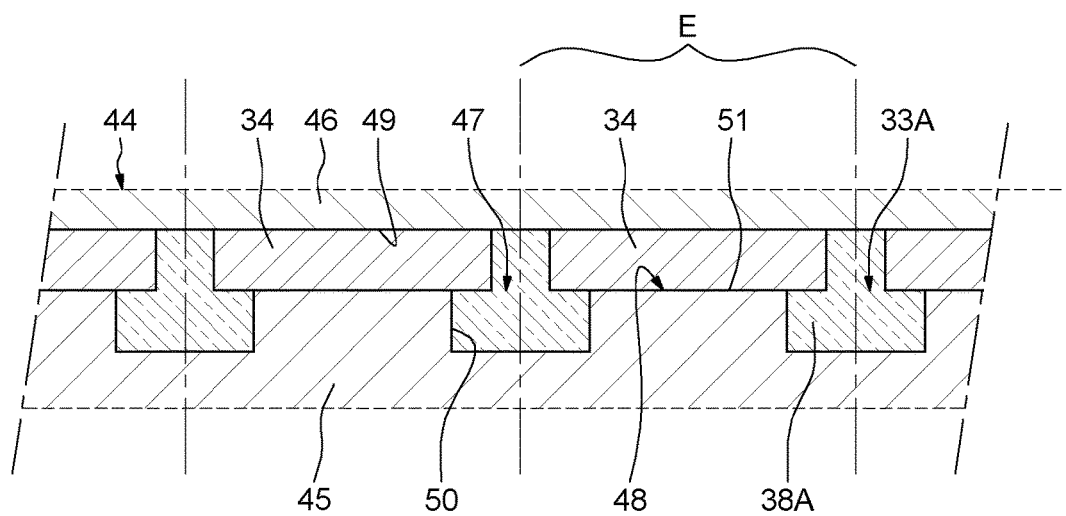
FIG. 9 shows a horizontal cross section of the mold of FIG. 8, in another step of manufacturing the encapsulation cover.
Figure 10:
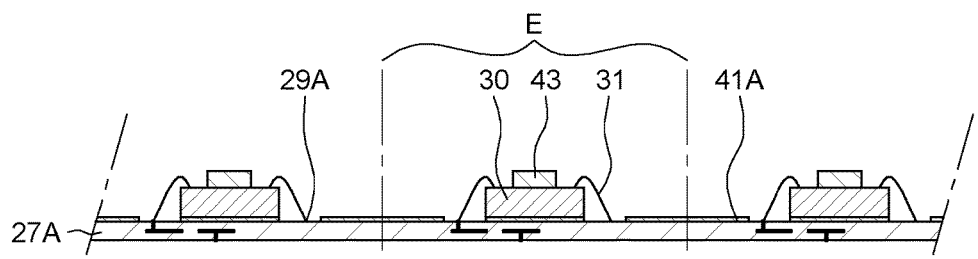
FIG. 10 shows a step of manufacturing the package of FIG. 7, in cross section.

Next, as illustrated in FIG. 9, an opaque coating material, for example a thermosetting epoxy resin, is injected into the cavity 47 of the mold 44 and this coating material is set.

After removal from the mold, a collective substrate 33A is obtained which is provided with a plurality of cross-shaped ribs 38A at the locations of the grooves 50 and provided with inserts 34, which inserts are integrated and held within the coating material forming the collective substrate 33A, the latter being overmolded around the inserts 34.

According to one variant embodiment, the collective substrate 33A is cut along the rows and columns delimiting the sites E in order to obtain covers 32.

Figure 11:
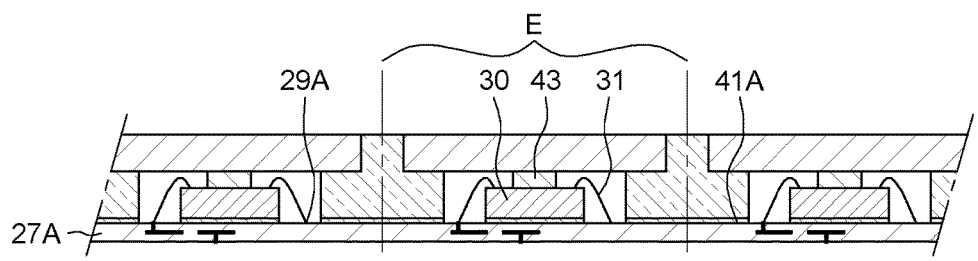
FIG. 11 shows another step of manufacturing the package of FIG. 1, in cross section.

According to another variant embodiment, as illustrated in FIG. 11, a collective carrier substrate 27A is obtained which is provided, at sites E corresponding to electronic packages 26 to be obtained, with respective electronic connection networks 28 and which is provided, on its front face 29A, with electronic chips 30 at respective adjacent sites E and with electrical wires 31.

Next, collective strips of adhesive 41A are spread over the front face 29A of the collective carrier substrate 27A, straddling the rows and columns separating the sites E with a view to obtaining the strips of adhesive 41 of the packages 26 to be obtained. Local blobs of conductive adhesive are deposited on the chips 30, corresponding to local spacers 43 to be obtained.

Next, the overmolded collective substrate 33A, provided with ribs 38A and with inserts 34, is placed so that the ribs 38A are on top of the collective strips of adhesive 41A and the inserts 34 are on top of the adhesive spacers 43, and the adhesive is set so as to fix the collective substrate 33A above the collective carrier substrate 27A and the inserts 34 on top of the spacers 43.

Next, the assembly formed is cut along rows and columns separating the sites E, perpendicularly to the collective carrier substrate 27A and through the overmolded collective substrate 33A and the ribs 38A, between and at a distance from the inserts 34.

A plurality of electronic packages 26, produced at the sites E, is then obtained.

Figure 12:
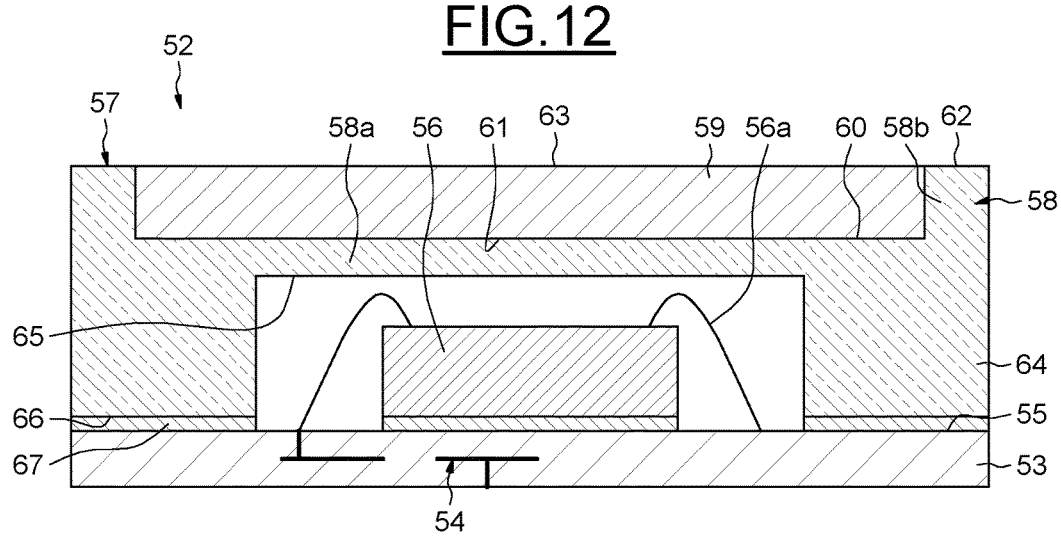
FIG. 12 shows a cross section of another electronic package.

FIG. 12 illustrates an electronic package 52 which comprises a carrier substrate 53 including an integrated network of electrical connections 54 and provided, on a front mounting face 55, with an electronic chip 56, the chip 56 being connected to the electrical connection network 54 by electrical connection wires 56a.

The electronic package 52 comprises an encapsulation cover 57 which comprises an overmolded solid substrate 58, made of a coating material, which extends in front of and at a distance from the chip 56 and the electrical connection wires 56a, and an insert 59 which takes the form of a plate which is inserted into a front space 60 of the overmolded substrate 58, such that the overmolded substrate 58 has a part 58a which covers a back face 61 of the insert 59 and a part 58b which surrounds the periphery of the insert 59. The overmolded substrate 58 and the insert 59 have front faces 62 and 63, respectively, located in one and the same plane parallel to the carrier substrate 53. In this arrangement, the insert 59 does not pass through the overmolded substrate 58.

In the same way as for the electrical package 26, the overmolded substrate 58 is provided, as one piece, with a ring-shaped rib 64 which protrudes with respect to a back face 65 of the overmolded substrate 58 and which is located around and at a distance from the periphery of the chip 56 and the electrical connection wires 56a.

The ring-shaped rib 64 has a back face 66 which is fixed to the front face 55 of the carrier substrate 53 by way of a local ring-shaped strip of adhesive 67.

According to one variant embodiment, the insert 59 may be made of a metal material capable of forming an electromagnetic protection screen between the chip 56 and the exterior. In addition, the insert 59 may form a means for enhancing the dissipation of heat generated by the chip 56 to the outside.

The encapsulation cover 57 is the result of a wafer-scale manufacturing process which will now be described.

Figure 13:
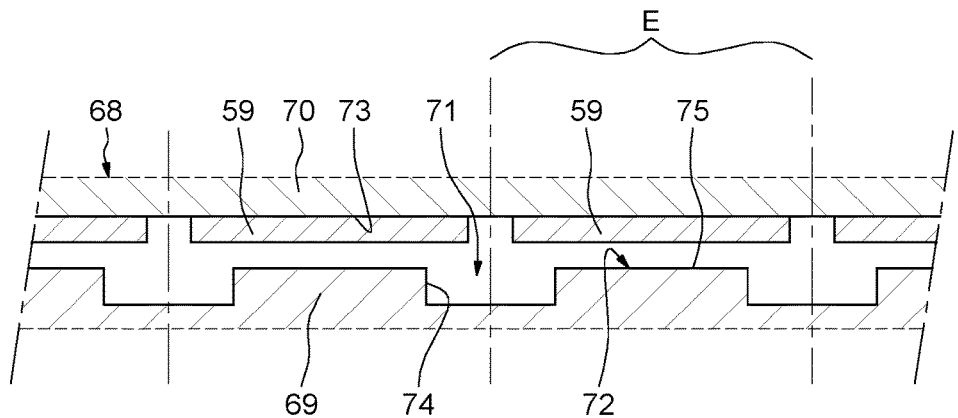
FIG. 13 shows a cross section of a mold for manufacturing an encapsulation cover for the package of FIG. 12, in one manufacturing step.

As illustrated in FIG. 13, a mold 68 is obtained which comprises two parts 69 and 70 between which a cavity 71 is formed. The parts 69 and 70 of the mold 68 have opposite faces 72 and 73 which delimit the cavity 71 in the direction of the thickness of the covers 57 to be obtained.

The face 72 of the part 69 of the mold 68 has adjacent sites E arranged in a matrix, corresponding to covers 57 to be obtained. The face 72 has cross-shaped grooves 74 which are formed along rows and columns of the matrix forming the sites E and which are of equal depth.

Thus, at each site E, the face 72 of the part 69 of the mold 68 comprises flat zones 75 which are circumscribed by corresponding portions of the grooves 74.

The face 73 of the part 70 of the mold 68 is flat and parallel to the zones 75 of the part 69 of the mold 68.

A plurality of inserts 59 is also obtained.

With the mold 68 open, inserts 59 are placed such that, when the mold is closed, the front faces 63 of the inserts 59 are adjoined to the face 73 of the part 70 of the mold 68 and the back faces 61 of the inserts 59 are at a distance from the zones 75 of the part 69 of the mold 68, at the respective sites E corresponding to covers 57 to be obtained. In this position, the inserts 59 are at a distance from one another by leaving free spaces between them which communicate with the grooves 74 and by leaving free spaces between the back faces 61 of the inserts 59 and the zones 75 of the face 72 of the part 69 of the mold 68.

Figure 14:
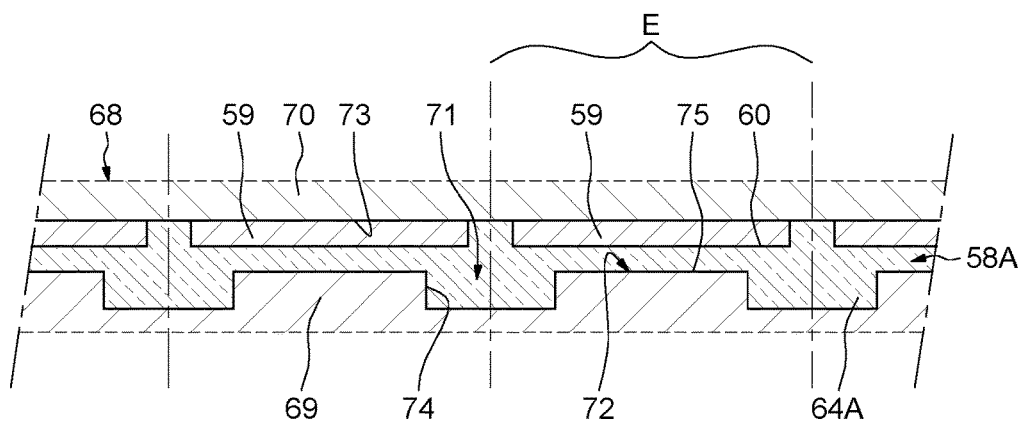
FIG. 14 shows a horizontal cross section of the mold of FIG. 13, in another step of manufacturing the encapsulation cover.

Next, as illustrated in FIG. 14, an opaque coating material, for example a thermosetting epoxy resin, is injected into the cavity 71 of the mold 68 and this coating material is set.

After removal from the mold, a collective substrate 58A is obtained which is provided with a plurality of cross-shaped ribs 64A at the locations of the grooves 74 and provided with inserts 59, which inserts are integrated and held within spaces 60 in the coating material forming the collective substrate 58A, the latter being overmolded around the inserts 59.

According to one variant embodiment, the collective substrate 58A is cut along the rows and columns delimiting the sites E in order to obtain covers 57.

Figure 15:
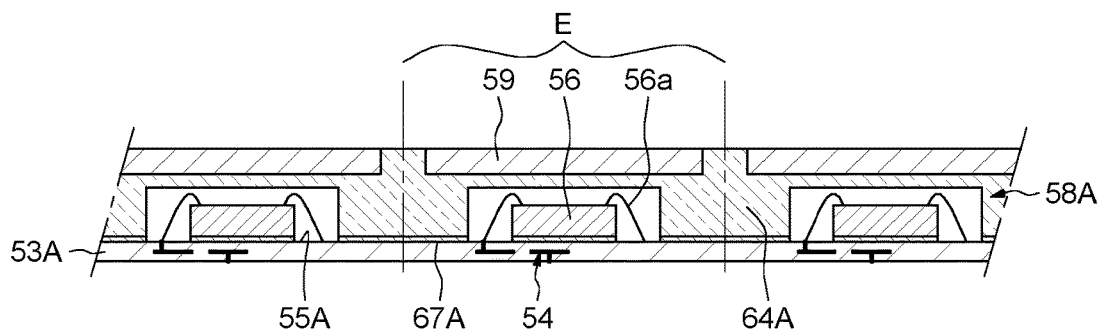
FIG. 15 shows a step of manufacturing the package of FIG. 12, in cross section.

According to another variant embodiment, as illustrated in FIG. 15, a collective carrier substrate 53A is obtained which is provided, at sites E corresponding to electronic packages 52 to be obtained, with respective electronic connection networks 54 and which is provided, on its front face 55A, with electronic chips 56 at respective adjacent sites E and with electrical connection wires 56a.

Collective strips of adhesive 67A are spread over the front face 55A of the collective carrier substrate 53A, straddling the rows and columns separating the sites E with a view to obtaining the strips of adhesive 67 of the packages 52 to be obtained.

Next, the overmolded collective substrate 58A, provided with ribs 64A and with inserts 59, is placed so that the ribs 64A are on top of the collective strips of adhesive 67A, and the adhesive is set so as to fix the collective substrate 58A above the collective carrier substrate 53A.

Next, the assembly formed is cut along rows and columns separating the sites E, perpendicularly to the collective carrier substrate 53A and through the overmolded collective substrate 58A and the collective ribs 64A, between and at a distance from the inserts 59.

A plurality of electronic packages 52, produced at the sites E, is then obtained.

FIGS. 16 and 17 illustrate an electronic package 76 which differs from the electronic package 52 described with reference to FIG. 12 solely in that it comprises an encapsulation cover 77 the overmolded substrate 78 of which is provided with an insert 79, taking the form of a grating, in the place of the insert 59. This time, the overmolded substrate 78 comprises parts 78a that are included within the openings 79a of the insert 79 in the form of a grating.

The encapsulation cover 77 and the electronic package 76 may be manufactured in the same way as that which has been described above with reference to FIGS. 13 to 15.

Figure 18:
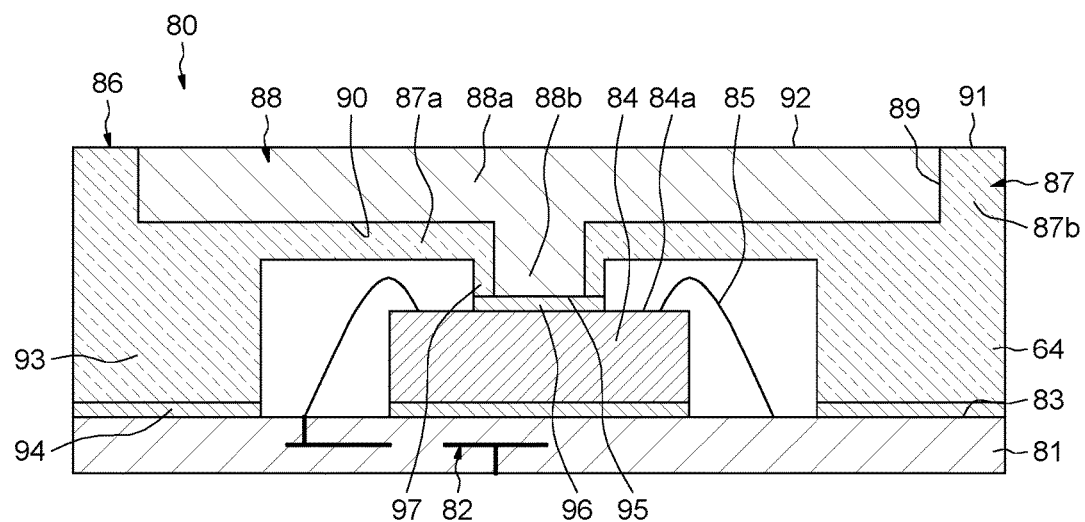
FIG. 18 shows a cross section of another electronic package.

FIG. 18 illustrates an electronic package 80 which comprises a carrier substrate 81 including an integrated network of electrical connections 82 and provided, on a front mounting face 83, with an electronic chip 84, the chip 84 being connected to the electrical connection network 82 by electrical connection wires 85.

The electronic package 80 comprises an encapsulation cover 86 which comprises, in the same way as for the electronic package 52 described with reference to FIG. 12, an overmolded solid substrate 87, made of a coating material, which extends in front of and at a distance from the chip 84 and the electrical connection wires 85, and an insert 88 which comprises a substrate 88a which is inserted into a front space 89 of the overmolded substrate 87, such that the overmolded substrate 87 has a part 87a which covers a back face 90 of the substrate 88a of the insert 88 and a part 87b which surrounds the periphery of the insert 88. The overmolded substrate 87 and the insert 88 have front faces 91 and 92, respectively, located in one and the same plane parallel to the carrier substrate 81, such that the front face 92 of the insert 88 is uncovered.

In the same way as for the electronic package 52 described with reference to FIG. 12, the overmolded substrate 87 is provided with a ring-shaped rib 93 which protrudes backwards, the back face of which is fixed to the front face 83 of the carrier substrate 81 by way of a ring-shaped layer of adhesive 94.

In this exemplary embodiment, the insert 88 additionally comprises a rear portion 88b which protrudes backwards with respect to its back face 90, which forms a spacer. This rear portion 88b passes through the part 87b of the overmolded substrate 87 and is located above the central part of the chip 84. Thus, the insert 88 locally passes completely through the overmolded substrate 87.

The rear portion 88b of the insert 88 has a back face 95 which makes direct contact with the front face 84a of the chip 84 or is connected to this front face 84a by way of a local layer of adhesive 96.

In addition, the part 87a of the overmolded substrate 87 is provided with a portion 97 which protrudes backwards and which surrounds the rear portion 88b of the insert 88 so that the back face 95 is uncovered.

According to one variant embodiment, the insert 88 is made of a heat conducting material, for example a metal, and the local layer of adhesive 96 is made of a heat conducting material. Thus, the insert 88 included in the cover 86 forms a means for dissipating the heat generated by the chip 84 to the outside, via the layer of adhesive 96, if present, its rear portion 88b and its overmolded substrate 88a. The insert 88 may be made of a metal material capable of forming, in addition, an electromagnetic protection screen between the chip 84 and the exterior.

The encapsulation cover 86 is the result of a wafer-scale manufacturing process equivalent to that described above with reference to FIGS. 13 to 15.

Figure 19:
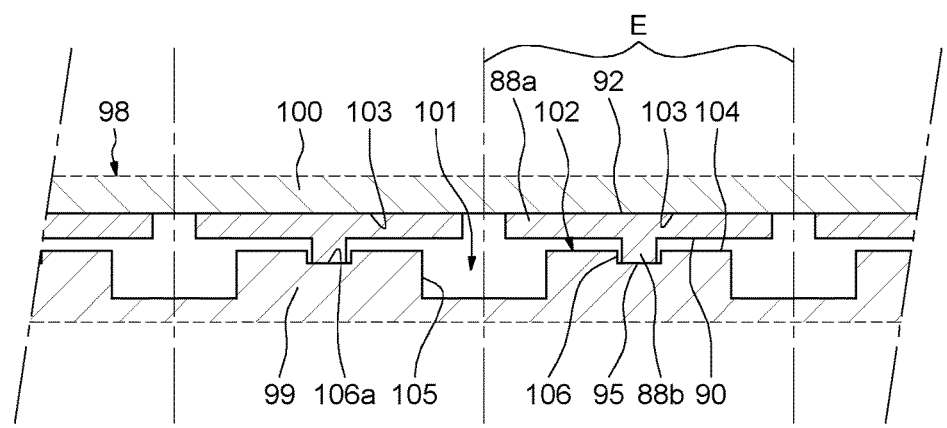
FIG. 19 shows a cross section of a mold for manufacturing an encapsulation cover for the package of FIG. 18, in one manufacturing step.

To this end, as illustrated in FIG. 19, a mold 98 comprises two parts 99 and 100 forming between them a cavity 101 and having opposite faces 102 and 103. The face 102 of the part 99 has, at the sites E, zones 104 separated by cross-shaped grooves 105 straddling the rows and columns separating the sites E.

This time, spaces 106 are made in the zones 104 of the part 99 of the mold 98. Inserts 88 are placed between the parts 99 and 100 of the mold 98, in the following positions. The front faces 92 of the inserts 88 bear against the flat face 103 of the part 100 of the mold 98. The back faces 95 of the protruding rear portions 88b of the inserts 88 bear against the bottoms 106a of the spaces 106 of the part 99 of the mold 98. Spaces are left free between the back faces 90 of the inserts 88 around the protruding rear portions 88b and the zones 104 of the face 102 of the part 99 of the mold 98 around the spaces 106. Free spaces are left between the periphery of the protruding rear portions 88b of the inserts 88 and the periphery of the spaces 106a.

The following steps of the wafer-scale manufacturing of the encapsulation cover 86 are equivalent to those described above with reference to FIGS. 13 to 15.

However, when assembling a collective overmolded substrate including a plurality of encapsulation covers 86, which substrate is equivalent to the collective overmolded substrate 58A, local layers of adhesive 95 should be deposited on the chips 84, which are mounted on a collective carrier substrate equivalent to the collective carrier substrate 53A, in order to connect the protruding rear portions 88b of the inserts 88 and the front faces of the chips 84.

The invention claimed is:

1. An electronic package, comprising:
  a carrier substrate;
  an electronic chip having a back face fixed to a front mounting face of the carrier substrate; and
  an encapsulation cover comprising:
    a substrate having a front face and a through passage; and
    an insert which is contained within the through passage and has a front face which is coplanar with the front face of the substrate,
    wherein said encapsulation cover is mounted to the front mounting face of said carrier substrate by way of an adhesive interposed between a peripheral zone of the carrier substrate and a peripheral zone of a back face of said substrate such that the insert of the encapsulation cover is positioned above a front face of the electronic chip.

2. The package according to claim 1, wherein the adhesive is an annular bead of adhesive.

3. The package according to claim 1, wherein the adhesive is an annular strip of adhesive.

4. The package according to claim 1, where said substrate includes a ring-shaped rib surrounding said electronic chip at a distance, the encapsulation cover being mounted to said front mounting face of the carrier substrate at a rear face of said ring-shaped rib.

5. The package according to claim 1, wherein said insert has a back face that is wholly covered by said substrate.

6. The package according to claim 5, wherein said insert has a back face that is at least partly uncovered by said substrate.

7. The package according to claim 6, wherein said insert comprises a portion that protrudes backwards facing the front face of the electronic chip, said portion being at least partly uncovered by said substrate.

8. The package according to claim 7, wherein said portion that protrudes backward has a surface that is mounted to the front face of the electronic chip by way of a layer of adhesive.

9. The package according to claim 1, wherein said insert is made of a heat conducting material.

10. The package according to claim 1, wherein said insert is made of a material configured to form an electromagnetic protection screen.

11. The package according to claim 1, wherein said insert comprises a substrate.

12. The package according to claim 1, wherein said insert comprises a grating.

* * * * *